(12) United States Patent
Hirler et al.

(10) Patent No.: US 10,170,615 B2
(45) Date of Patent: Jan. 1, 2019

(54) SEMICONDUCTOR DEVICE INCLUDING A LATERAL TRANSISTOR

(71) Applicant: Infineon Technologies Austria AG, Villach (AT)

(72) Inventors: Franz Hirler, Isen (DE); Anton Mauder, Kolbermoor (DE); Andreas Meiser, Sauerlach (DE); Till Schloesser, München (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/415,958

(22) Filed: Jan. 26, 2017

(65) Prior Publication Data

US 2017/0222043 A1     Aug. 3, 2017

(30) Foreign Application Priority Data

Jan. 29, 2016   (DE) .................. 10 2016 101 679

(51) Int. Cl.
*H01L 29/78*    (2006.01)
*H01L 23/495*   (2006.01)
(Continued)

(52) U.S. Cl.
CPC .... *H01L 29/7825* (2013.01); *H01L 23/49575* (2013.01); *H01L 29/0634* (2013.01); *H01L 29/1095* (2013.01); *H01L 29/404* (2013.01)

(58) Field of Classification Search
CPC .............. H01L 29/7817; H01L 29/063; H01L 29/0634
See application file for complete search history.

(56) References Cited

U.S. PATENT DOCUMENTS 9,312,381 B1 *   4/2016  Bobde ................. H01L 29/7823
2009/0072368 A1 * 3/2009  Hu ......................... H01L 24/41
                                                            257/676
(Continued)

OTHER PUBLICATIONS

Lin, Ming-Jang "Lateral Superjunction Reduced Surface Field Structure for the Optimization of Breakdown and Conduction Characteristics in a High-Voltage Lateral Double Diffused Metal Oxide Field Effect Transistor" Jpn. J Appl. Phys. vol. 42 Part 1, No. 12 Dec. 2003 pp. 7227-7231.*

(Continued)

*Primary Examiner* — Asok K Sarkar
*Assistant Examiner* — Grant Withers
(74) *Attorney, Agent, or Firm* — Murphy, Bilak & Homiller, PLLC

(57) ABSTRACT

A semiconductor device includes a source region and a drain region of a first conductivity type. The source region and the drain region are arranged in a first direction parallel to a first main surface of a semiconductor substrate. The semiconductor device further includes a layer stack having a drift layer of the first conductivity type and a compensation layer of a second conductivity type. The drain region is electrically connected with the drift layer. The semiconductor device also includes a connection region of the second conductivity type extending into the semiconductor substrate, the connection region being electrically connected with the compensation layer, wherein the buried semiconductor portion does not fully overlap with the drift layer.

29 Claims, 15 Drawing Sheets

(51) Int. Cl.
*H01L 29/06* (2006.01)
*H01L 29/10* (2006.01)
*H01L 29/40* (2006.01)

(56) References Cited

U.S. PATENT DOCUMENTS

2011/0127586 A1 6/2011 Bobde et al.
2014/0151798 A1* 6/2014 Meiser ............... H01L 29/7816
257/339

OTHER PUBLICATIONS

Mauder, Anton et al., "Transistor Device", U.S. Appl. No. 15/280,734, filed Sep. 29, 2016, Claims priority to DE 102015116611.9 filed Sep. 30, 2015, pp. 1-41.

* cited by examiner

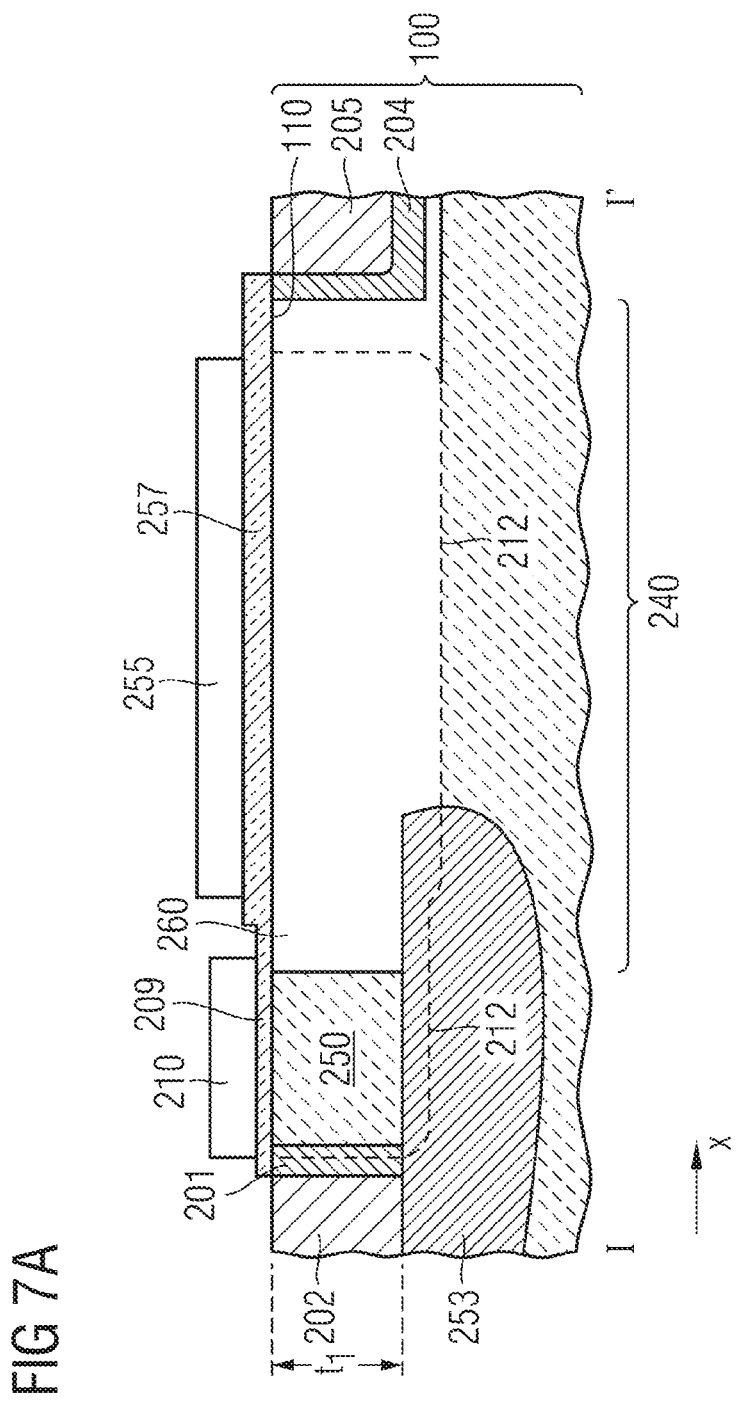

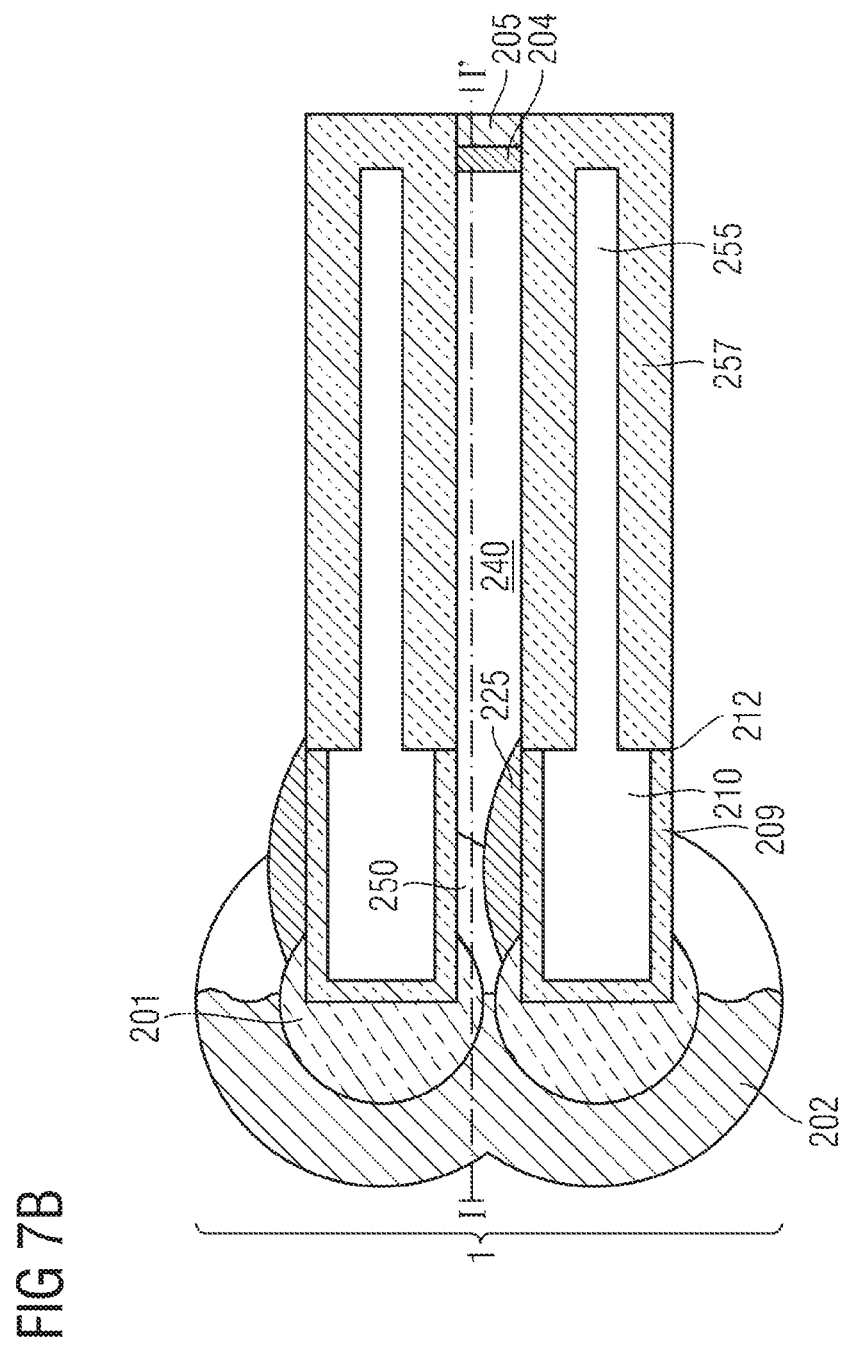

SEMICONDUCTOR DEVICE INCLUDING A LATERAL TRANSISTOR

BACKGROUND

Power transistors commonly employed in automotive and industrial electronics should have a low on-state resistance ($R_{on} \cdot A$), while securing a high voltage blocking capability. For example, a MOS ("metal oxide semiconductor") power transistor should be capable, depending upon application requirements, to block drain to source voltages $V_{ds}$ of some tens to some hundreds or thousands volts. MOS power transistors typically conduct very large currents which may be up to some hundreds of Amperes at typical gate-source voltages of about 2 to 20 V.

Further types of lateral MOS transistors are being developed, comprising a drain extension region or drift zone. In particular, developments on lateral transistors comprising a superjunction layer stack are being made.

SUMMARY

According to an embodiment, a semiconductor device comprises a source region and a drain region of a first conductivity type. The source region and the drain region are arranged in a first direction parallel to a first main surface of the semiconductor substrate. The semiconductor device further comprises a layer stack comprising a drift layer of the first conductivity type and a compensation layer of the second conductivity type. The drain region is electrically connected with the drift layer. The semiconductor device further comprises a connection region of the second conductivity type extending into the semiconductor substrate, the connection region being electrically connected with the compensation layer, wherein the buried semiconductor portion does not fully overlap with the drift layer.

According to a further embodiment, a semiconductor device comprises a drift contact region, a drain region of a first conductivity type, the drift contact region and the drain region being arranged in a first direction parallel to a first main surface of a semiconductor substrate. The semiconductor device further comprises a layer stack including a drift layer of the first conductivity type and a compensation layer of the second conductivity type. The drain region is electrically connected to the drift layer. The semiconductor device further comprises a connection region of the second conductivity type extending into the semiconductor substrate, the connection region being electrically connected with the compensation layer. The semiconductor device further comprises a buried semiconductor portion of the first conductivity type beneath the layer stack and in electrical contact with the drain region, the buried semiconductor portion having a soft doping profile.

According to an embodiment, a semiconductor device comprises a source region, a drain region, a body region adjacent to the source region, and a gate electrode configured to control a conductivity of a channel formed in the body region. The gate electrode is arranged in a gate trench extending in the semiconductor substrate. The semiconductor device further comprises a drift zone. The source region, the drain region, the body region and the drift zone are arranged in a first direction parallel to a first main surface of the semiconductor substrate. The semiconductor device further comprises a buried semiconductor portion of the second conductivity type beneath the body region, the buried semiconductor portion having a sort doping profile.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 7A shows a vertical cross-sectional view or a semiconductor device according to an embodiment.

FIG. 7B shows a horizontal cross-sectional view of the semiconductor device shown in FIG. 7A.

DETAILED DESCRIPTION

Figure 1A:
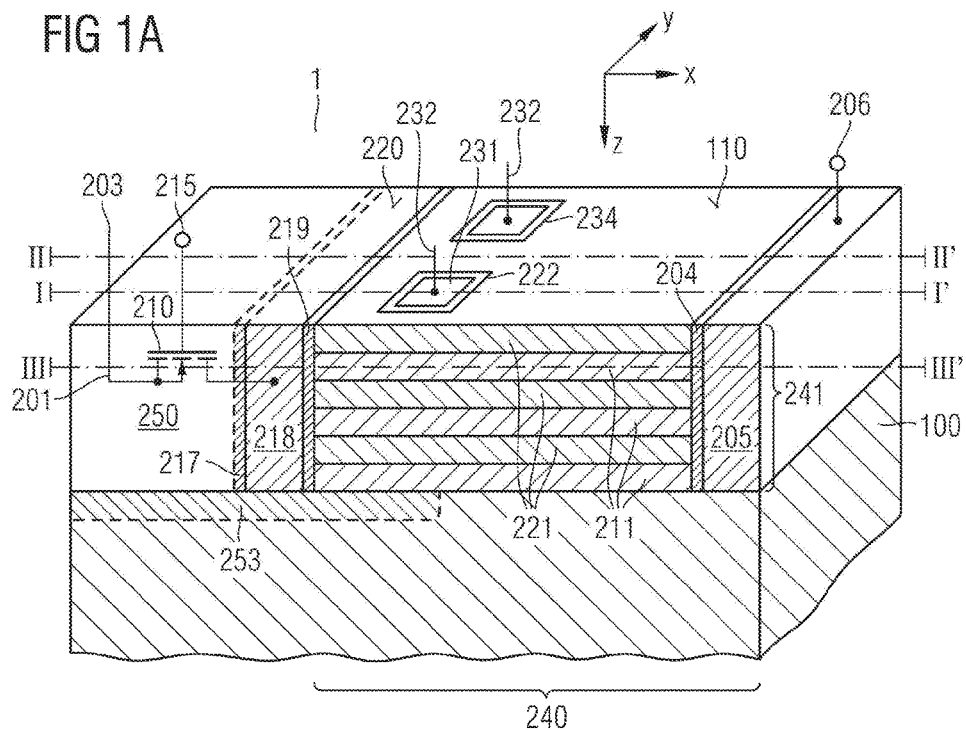
FIG. 1A shows a perspective view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "–" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and uncoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SIC) or gallium nitride (GaN) may form the semiconductor substrate material. According to embodiments described herein below, the semiconductor substrate may comprise several layers of the same or different conductivity types. Further, the several layers may be doped at different doping concentrations. For example, the semiconductor substrate may comprise several layers of the same conductivity type, the layers being doped at different doping concentrations.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

FIG. 1A shows a perspective view of a semiconductor device 1 according to an embodiment. The semiconductor device 1 comprises a transistor including a source region 201, a drain region 204, a gate electrode 210 and a drift zone 240. The drain region 204 may be of a first conductivity type and may extend into a depth direction (e.g. the z direction) of a semiconductor substrate 100. The source region 201 may be of the first conductivity type. In the following, the semiconductor device 1 will be described in terms of a first component 238 and a second component 239. The first component 238 comprises basic transistor elements such as the source region 201, a transistor contact portion 217 of the same conductivity type as the source region 201 and a body portion 250. A gate electrode 210 is configured to control a conductivity of a channel (conductive inversion layer) formed in the body region 250 between the source region 201 and the transistor contact portion. The second component comprises a drift contact region 218, the drift zone 240 and the drain region 204. The drift contact region 218 contacts the transistor contact portion 217. The first component 238 may be implemented in an arbitrary manner so that a detailed description thereof is omitted at the present stage.

The drift contact region 218 and the drain region 204 are arranged in a first direction parallel to a first main surface 110 of the semiconductor substrate 100. The semiconductor device further comprises a layer stack 241 comprising a drift layer 211 of the first conductivity type and a compensation layer 221 of the second conductivity type. The drain region 204 is electrically connected with the drift layer 211. The semiconductor device further comprises a connection region 222 of the second conductivity type extending into the depth direction of the semiconductor substrate 100. The connection region 222 is electrically connected with the compensation layer 221. The semiconductor device 1 further comprises a buried semiconductor portion 253. According to an embodiment, the buried semiconductor layer 253 may be of the second conductivity type. According to a further embodiment, the buried semiconductor layer 253 may be of the first conductivity type. The buried semiconductor layer 253 may be disposed beneath the layer stack and in electrical contact with the connection region 222. The buried semiconductor portion 253 does not fully overlap with the drift layer 211.

The transistor shown in FIG. 1A implements a lateral transistor, i.e. a transistor in which a current flow mainly is accomplished in a horizontal direction. The transistor comprises a drift zone 240 which includes a superjunction layer stack 241. The super junction layer stack 241 may comprise a sequence of doped single-crystalline semiconductor sublayers 211, 221 having reverse polarity. For example, a doped layer of the first conductivity type may be followed by a layer of the second conductivity type and vice versa. The layer of the first conductivity type may implement a drift layer 211 and the layer of the second conductivity type may implement a compensation layer 221. According to an embodiment, the layer stack 241 may comprise at least two or three drift layers 211 and at least two or three compensation layers 221.

In so-called compensation devices comprising a superjunction layer stack 241, when an off-voltage is applied to the transistor, a current flow can be effectively blocked since charge carriers of adjacent sublayers, each having a different doping type, compensate each other. As a consequence, adjacent p- and n-doped regions are caused to fully deplete in an off-state. As a result, for achieving similar breakdown characteristics as a conventional device, the doping concentration of the doped layers may be increased, resulting in a reduced resistivity in an on-state. In a superjunction layer stack, the thickness of each of the sublayers 211, 221 may be selected so that in a case of an off-voltage, the layers may be fully depleted. For example, the layer stack 241 may have a thickness of 2 to 200 μm or more, for example, 10 to 100 μm. The thickness of the individual layers 211, 221 may be 0.1 to 5 μm. As is readily appreciated, the drift layers 211 should be connected with the active portions of the transistor, e.g. the transistor contact 217, by means of a low-ohmic connection. Moreover, the compensation layers should be electrically connected to an appropriate potential by means of a suitable connection element. The drift layers 211 and the compensation layers 221 are formed as horizontal layers. To be more specific, a main surface of each of the layers may be parallel to the first main surface 110 of the semiconductor substrate 100.

According to the embodiment shown in FIG. 1A, the connection region 222 is of the second conductivity type and extends into the depth direction of the semiconductor substrate. For example, the connection region 222 extends to a bottom portion of the layer stack 241. The connection region 222 may form a doped sidewall of a hole trench 234 which is formed in the first main surface 110 of the semiconductor substrate. The inner portion of the hole trench 234 may be filled with a conductive material such as doped polysilicon, doped monocrystalline silicon, a silicide or a metal to form the connection contact 231. The connection contact 231 may be electrically connected to a connection terminal 232. A plurality of hole trenches 234 in which the connection regions 222 and the connection contacts 231 are disposed may be arranged along a second direction perpendicular to the first direction (e.g. the y direction). According to an embodiment, the buried semiconductor portion 253 is disposed below and in direct contact with the connection portion 222 and the connection contact 231.

The drift layer 211 may be electrically connected to a drift contact region 218, for example, via a drift contact doping 219. For example, the drift contact region 218 may be arranged in a contact groove 220 that extends in a second direction, e.g. the y direction, parallel to the first main surface 110. A sidewall of the drift contact groove 220 facing the layer stack 241 may have a doped sidewall 219 so as to enable a contact to the drift layer 211. An opposing sidewall of the drift contact groove may be appropriately doped to form a transistor contact portion 217. The transistor contact portion 217 is electrically connected to the drift layer 211 via the drift contact region 218.

According to embodiments, the semiconductor device 1 may further comprise a body region 250 which is disposed between the transistor contact portion 217 and the source region 201. A gate electrode 210 may be disposed adjacent to the body region 250. For example, the gate electrode 210 may be insulated from the body region 250 by means of a gate dielectric layer 209.

When the transistor is switched on e.g. by applying an appropriate voltage to the gate electrode 210 via the gate terminal 215, a conductive inversion layer (channel) is formed at the boundary between the body region 250 and the gate dielectric layer 209. Accordingly, the transistor is in a conducting state from the source region 201 to the drain region 204 via the drift zone 240.

When a voltage corresponding to an off-state is applied to the gate electrode 210, no conductive channel is formed at the boundary between the body region 250 and the gate dielectric layer 209 so that no current flows. Further, the drift layers 211 of the superjunction layer stack 241 may be fully depleted so that a current flow is prevented and the device has high voltage characteristics. The source region 201 may be connected to a source terminal 203. For example, the source terminal 203 may be held at ground potential. Further, the connection region 222 may be electrically connected via the connection contact 231 to a connection terminal 232. According to an embodiment, the connection contact 231 may be electrically connected to the source region 201 via the source contact 202. The depletion of the drift layers 211 of the superjunction layer stack 241 is caused by the voltage at the connection portion 222 which is negative with respect to the drift contact region 218.

The semiconductor device further comprises a buried semiconductor portion 253. The buried semiconductor portion 253 may, for example, be of the second conductivity type and may be disposed beneath the layer stack and may be electrically connected with the connection region 222. The buried semiconductor portion 253 of the second conductivity type may be directly adjacent to a drift layer 211. For example, the lowermost layer of the layer stack 241 may be a drift layer 211. For example, the buried semiconductor portion may laterally extend to a portion below the source region 201.

According to embodiments, the buried semiconductor portion 253 does not fully overlap with the drift layer 211. Accordingly, the buried semiconductor portion 253 only partially overlap with the drift layer 211 in a horizontal direction. For example, there may be a horizontal portion of the drift layer 211 at which the buried semiconductor portion 253 is not present. A portion of the buried semiconductor portion 253 may be disposed beneath the body region 250. According to an embodiment, the area of the buried semiconductor portion 253 may be approximately equal to or smaller or even larger than the area of the drift layer 211, the buried semiconductor portion 253 being shifted along the first direction with respect to the drift layer 211. Due to the presence of the buried semiconductor portion 253, the current blocking characteristics may be further improved. Further, peaks of an electrical field may be avoided. According to an embodiment, a doping profile of the buried layer or buried portion may be a so-called "soft doping profile" which will be explained below with reference to FIG. 1D.

Figure 1B:
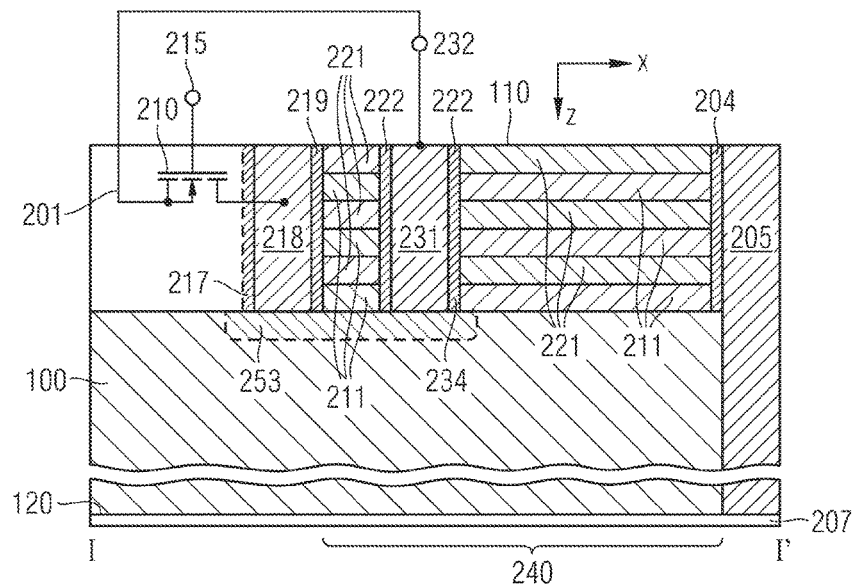
FIGS. 1B and 1C show cross-sectional views of the semiconductor device shown in FIG. 1A.

FIG. 1B shows a vertical cross-sectional view of a semiconductor device according to an embodiment. It is to be noted that the cross-sectional view of FIG. 1B shows features which are not shown in FIG. 1A. These features may be implemented as optional features. Basically the cross-sectional view of FIG. 1B is taken between I and I as is indicated in FIG. 1A so as to intersect the hole trenches 234. Since the embodiment shown in FIG. 1B comprises several elements which have already been discussed while referring to FIG. 1A, a detailed description thereof is omitted. As is to be clearly understood, the elements which have been described with reference to FIG. 1A and which are present in FIG. 1B show the same functionality in the device of FIG. 1B, unless otherwise indicated. As is shown in FIG. 1B, the buried semiconductor portion 253 of the second conductivity type is electrically connected with the connection region 222. The buried semiconductor portion 253 is formed in physical contact with the lower portion of the layer stack 241 and the connection region 222. For example, the buried semiconductor portion 253 may physically contact the drift layer 211. According to the embodiment shown in FIG. 1B, the buried semiconductor portion 253 is disposed below only a part of the body portion 250 and does not extend to the source region 201.

The connection region 222 is electrically connected via the connection contact 231 to a terminal 232 which is connected to the source region 201. The drain contact 205 may be formed so as to extend to the second main surface 120 of the semiconductor substrate. For example, a drain conductive layer 207 may be arranged on a second main surface 120 of the semiconductor substrate, and the drain contact 205 may be electrically connected to the drain conductive layer 207. According to a further embodiment, the drain conductive layer 207 may be buried in the semiconductor substrate 100.

Figure 1C:
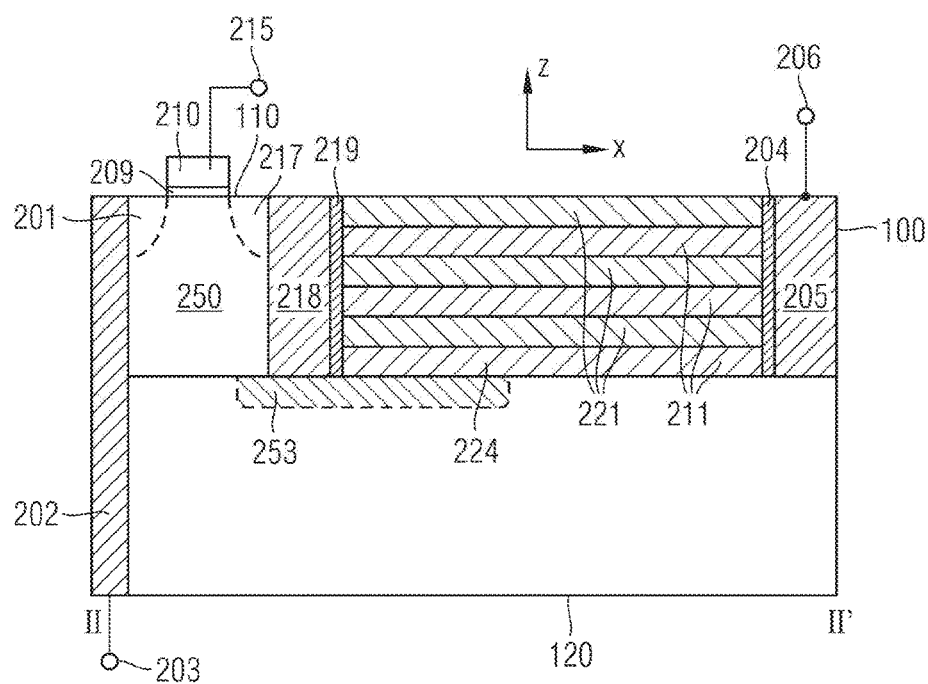

The semiconductor substrate 100 may comprise several layers or portions of different doping types. According to the embodiment of FIG. 1B, the semiconductor substrate 100 may be of the first conductivity type so as to electrically insulate the drain region from other components of the semiconductor device. In this embodiment, the buried semiconductor layer 253 insulates the drain contact 205 from the drift contact region 218. According to further embodiments, the drain region 204 and the drain contact 205 may be segmented along the y-direction. For example, a plurality of drain contact grooves (not shown) having a shape similar to that of the hole trenches 234 may be disposed in the semiconductor substrate 100. A conductive material may be filled in the drain contact grooves to form the drain contacts 205. Sidewalls of the drain contact grooves may be doped to form the drain region. Moreover, in a corresponding manner, the drift contact groove 220 may be segmented to form a plurality of separated drift contacts 218. The sidewalls of the drift contact grooves 220 may be doped to form the transistor contact portion 217 and the contact doping 219. FIG. 1C shows a cross-sectional view of a semiconductor device according to an embodiment. According to the embodiment of FIG. 1C, the source region 201, the body region 250 and the transistor contact portion 217 may be arranged along the first direction. The gate electrode 210 may, for example, be implemented as a planar gate electrode which may be in contact with a gate dielectric 209 that contacts a horizontal surface 110 of the body region. The gate electrode 210 may be disposed over the semiconductor substrate 100. The transistor contact portion 217 may be connected via the drift contact region 218 to the drift layer 211. According to the embodiment shown in FIG. 1C, the source contact 202 extends to the second main surface 120. The source terminal 203 may be arranged at a side of the second main surface 120. The source contact 202 may be disconnected from components at the first main surface 110.

Figure 1D:
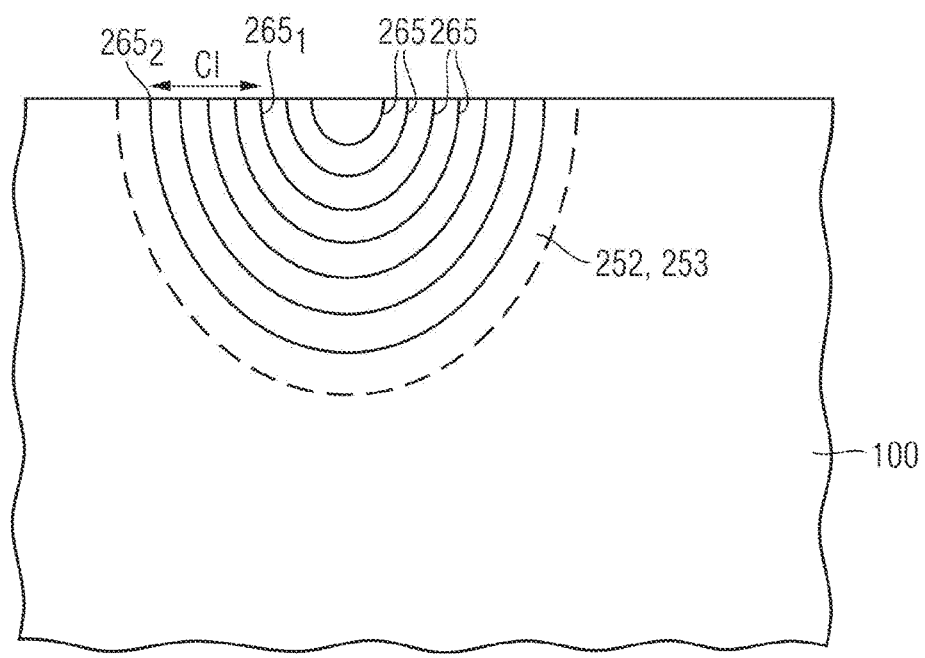
FIG. 1D shows a cross-sectional view of an example of a doped semiconductor substrate having soft doping profile.

The term "soft doping profile" will be explained in the following in more detail with reference to FIG. 1D. The explanation refers to a doping with the first or the second conductivity type independent of whether the semiconductor material to be doped is of the first or second conductivity type. In more detail, pn junctions as well as homojunctions may have a soft doping profile. Generally, after performing a doping process by ion implantation, the doped portion will have a Pearson like distribution of the dopants. Due to thermal processing steps, the dopants may further diffuse in the semiconductor material resulting in a Gaussian density distribution of the dopants. A parameter for describing a soft doping profile relates to the so-called characteristical length, which is the length along which the doping concentration decreases to a value of 1/e of a reference value of the doping concentration. For example, in a portion having a soft doping profile, a characteristical length may be 0.5 µm to 10 µm, e.g. 4 to 8 µm. FIG. 1D illustrates a semiconductor substrate 100 having a doped portion 252, 253 with a soft doping profile. Reference numeral 265 indicates the contours of equal doping level. Differently speaking, along any of the contours 265, the doping level is approximately equal. For example, with the doping level decreasing to 1/e from contour $265_1$ to contour $265_2$, the distance from contour $265_1$ to contour $265_2$ corresponds to the characterstical length cl of the doping profile.

For implementing a soft doping profile, a maximum doping concentration may be $1E15$ $cm^{-3}$ to $1E17$ $cm^{-3}$. A typical implantation dose may be $3E12$ to $6E13$ $cm^{-2}$ when performing an ion implantation process. A doping concentration of the adjacent semiconductor material may be $1E14$ $cm^{-3}$. As a result, a pn junction or homojunction formed between the doped portion and the adjacent semiconductor material may have improved properties. For example, the electrical field generated at the junction may be smooth and peaks or edges of the electrical field may be avoided. Generally, the doping type of the semiconductor substrate may be n type or p type. For example, when the semiconductor device 1 is a source down device, as is e.g. illustrated in FIG. 1C, the substrate may be a p type substrate. When the semiconductor device 1 is a drain down device, as is e.g. illustrated in FIG. 1B, the substrate may be an n type substrate.

According to examples, such a soft doping profile may be formed by performing a masked ion implantation process for introducing dopants into the semiconductor layer. Thereafter, a diffusion step is performed at a high temperature. For example, the surface of the semiconductor substrate may be covered by an oxide during this processing step. Thereafter, the layer stack 241 may be formed e.g. by subsequently depositing the differently doped layers or by performing corresponding ion implantation steps. During these processes, the semiconductor device is subjected to low temperatures so as to maintain the doping profile of the buried semiconductor portion and the layer stack.

Figure 2A:
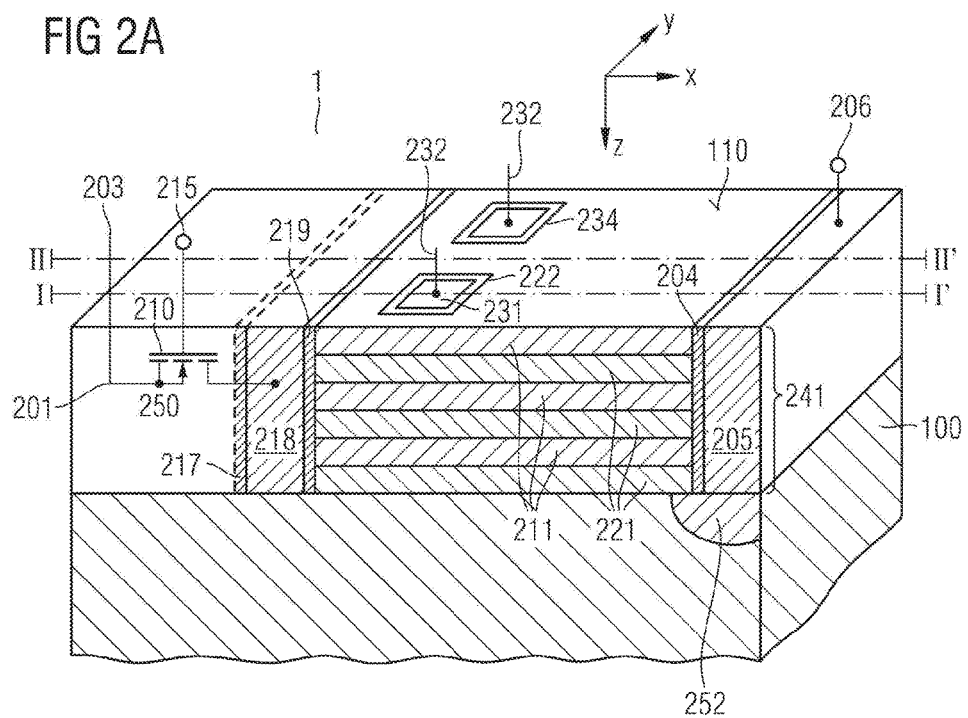
FIG. 2A shows a perspective view of a semiconductor device according to a further embodiment.

FIG. 2A shows a semiconductor device according to a further embodiment. The semiconductor device shown in FIG. 2A comprises similar components as have been described above with reference to FIGS. 1A to 1C. Further, the semiconductor device 1 comprises a buried semiconductor portion 252 of the first conductivity type which is electrically connected to the drain region 204. The further components may be similar to those as have been discussed above. The semiconductor device shown in FIG. 2A comprises a source region 201 and a drain region 204 of a first conductivity type. The drain region 204 extends in a depth direction (e.g. the z-direction) of a semiconductor substrate 100. The source region 201 and the drain region 209 are arranged at a first direction (e.g. the x-direction) parallel to a first main surface 110 of the semiconductor substrate 100. The semiconductor device further comprises a layer stack 241 comprising a drift layer 211 of the first conductivity type and a compensation layer 221 of the second conductivity type. The drain region 204 is electrically connected to the drift layer 211.

The semiconductor device further comprises a connection region 222 of the second conductivity type extending into the depth direction of the semiconductor substrate. The connection region 222 is electrically connected to the compensation layer 221. The semiconductor device further comprises a buried semiconductor portion 252 of the first conductivity type which is disposed beneath the layer stack and is in electrical contact with the drain region 204. The buried semiconductor portion of the first conductivity type has a soft doping profile as has been explained above with reference to FIG. 1D. Due to this doping profile, peaks of an electrical field may be avoided which result in improved properties of the semiconductor device. For example, the buried semiconductor portion 252 of the first conductivity type may be directly adjacent to a compensation layer 221 of the second conductivity type. In other words, the lowermost layer of the layer stack may be implemented by a compensation layer 221. In another embodiment, it is implemented as a drift layer 211. For example, the compensation layer 221 and the drift layer 211 may be doped at a higher doping concentration than the adjacent semiconductor substrate material. For example, the drift layer 211 and the compensation layer 221 may be doped at a concentration in a range from $10^{-15}$ cm$^{-3}$ to $5 \cdot 10^{16}$ cm$^{-3}$.

According to embodiments, the buried semiconductor portion 252 does not fully overlap with the compensation layer 221. Accordingly, the buried semiconductor portion 252 may only partially overlap with the compensation layer 221. A portion of the buried semiconductor portion 252 may be disposed beneath the drain contact 205.

Figure 2B:
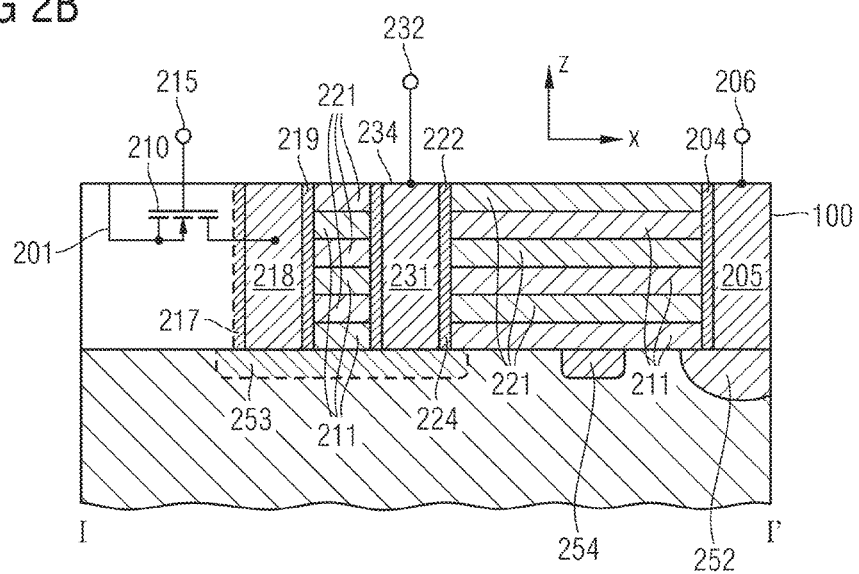
FIGS. 2B and 2C show cross-sectional views of a corresponding semiconductor device.

FIG. 2B shows a cross-sectional view of the semiconductor device which is taken between I and I' as is indicated in FIG. 2A. The cross-sectional view of FIG. 2B is taken so as to intersect the hole trench 234 in which the connection region 222 and the connection contact 231 are disposed. In addition to the elements illustrated in FIG. 2A, the semiconductor device of FIG. 2B may comprise a buried semiconductor portion 253 of the second conductivity type which may be electrically connected to the connection region 222. The doping profile of the buried semiconductor portion 253 of the second conductivity type may be a soft doping profile as has been explained above. According to further embodiments, the doping profile does not need to be a soft doping profile.

The semiconductor device may further comprise a floating semiconductor portion 254 which may be of the first or the second conductivity type. The floating semiconductor portion may be arranged beneath the layer stack 241. The floating semiconductor portion 254 may be disconnected from an external terminal.

Figure 2C:
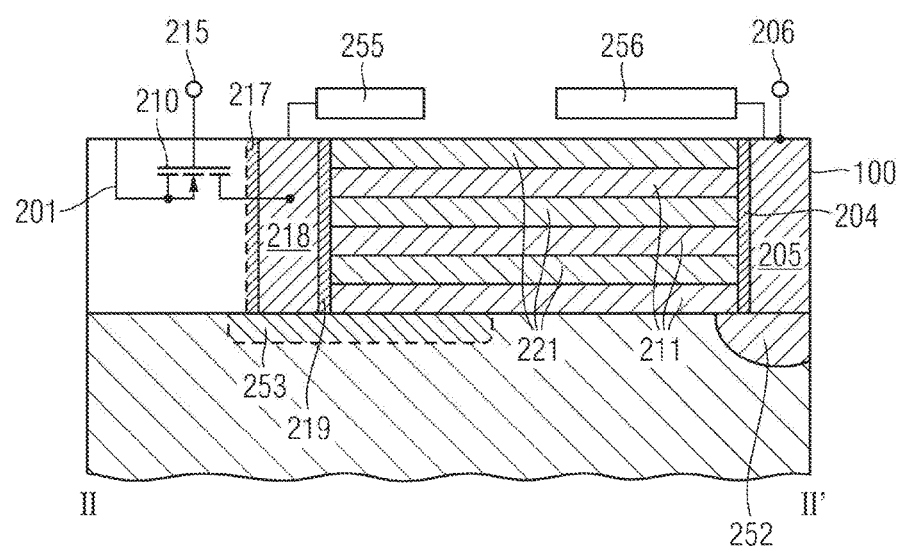

FIG. 2C shows a further cross-sectional view of the semiconductor device. The cross-sectional view of FIG. 2C is taken between II and II', as is also indicated in FIG. 2A. The semiconductor device shown in FIG. 2C comprises a buried semiconductor portion 253 of the second conductivity type which is electrically connected to the connection region 222 (not shown in this cross-sectional view). The semiconductor device further comprises a buried semiconductor portion 252 of the first conductivity type which is electrically connected to the drain region 204. The semiconductor device may further comprise a first field plate 255. The first field plate 255 may be disposed at a side remote from the drain region 204. For example, the first field plate 255 may be disposed at the drift contact region 218 or at the connection portion 222. The first field plate 255 may be electrically connected to the drift contact region 218. The first field plate 255 may be electrically connected to another appropriate terminal, e.g. the source terminal. The first field plate 255 may be insulated from the semiconductor layers 211, 221 by means of an insulating layer. The semiconductor device may further comprise a second field plate 256. The second field plate 256 may be disposed at a side of the drain portion 204. Further, the second field plate 256 may be electrically connected to the drain contact 205. Alternatively, the second field plate 256 may be electrically connected with another terminal. The second field plate 256 may be insulated from the semiconductor layers 211, 221 by means of an insulating layer.

As is clearly to be understood, any of the first and second field plates 255, 256 may also be present in the semiconductor device that has been explained above with reference to FIGS. 1A to 1D.

According to embodiments, the doping profile of the buried semiconductor portion 252 of the first conductivity type or of the buried semiconductor portion 253 of the second conductivity type and the distance of the respective buried portions 252, 253 to the second main surface 120 should be adjusted that in case of a breakdown, the breakdown takes place in a vertical direction rather than in a lateral direction, e.g. at an edge of the semiconductor device. As a result, the robustness to avalanche breakdown may be increased.

Figure 3A:
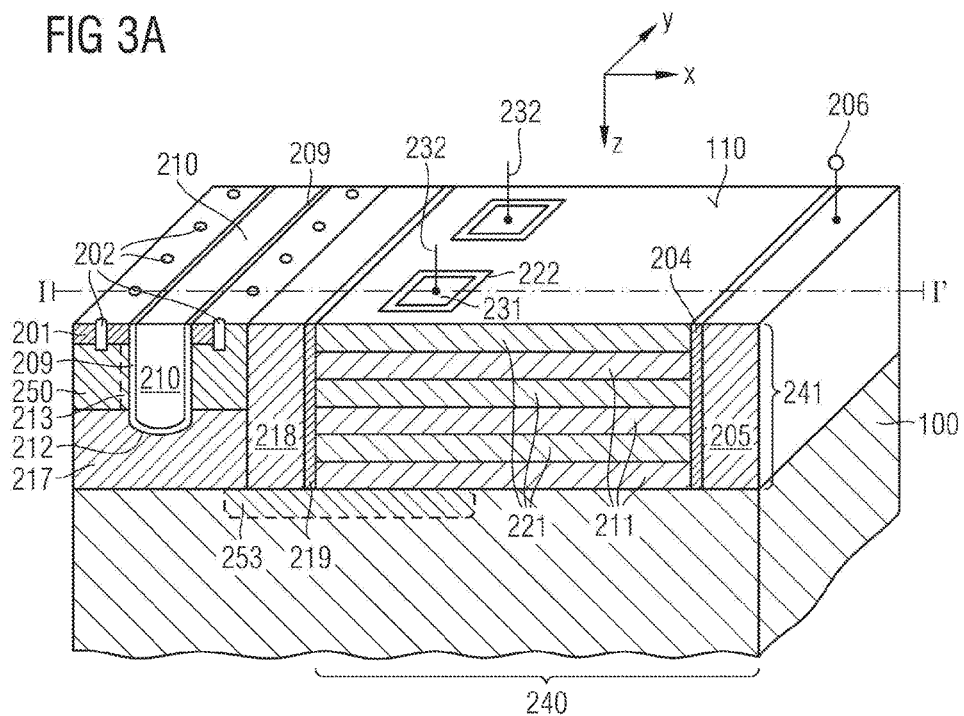
FIG. 3A shows a perspective view of a semiconductor device according to a further embodiment.

FIG. 3A shows a perspective view of a semiconductor device according to a further embodiment. The basic device structure is similar to the device structure which has been explained above with reference to FIGS. 1A to 2C. FIG. 3A further illustrates elements of the active transistor portion including the gate electrode 210. As illustrated in FIG. 3A, the gate electrode 210 may be arranged in a gate trench 212 that is disposed in the first main surface 110 of the semiconductor substrate. The gate trench 212 may extend in the depth direction and in the second direction, the y-direction. A gate dielectric layer 209 may be disposed at a sidewall of the gate trench 212. Further, a gate electrode 210 is disposed within the gate trench 212.

The source region 201 is disposed at the first main surface 110 of the semiconductor substrate. A transistor contact portion 217 is disposed at a distance from the first main surface 110 in a direction perpendicular to the first main surface 110. The transistor contact portion 217 horizontally extends in the semiconductor substrate. To be more specific, the transistor contact portion 217 implements a buried semiconductor portion. The transistor contact portion 217 may be of the first conductivity type. A body region 250 may be disposed between the source region 201 and the transistor contact region 217. When the transistor is switched on e.g. by applying a suitable voltage to the gate electrode 210, a conductive inversion layer (channel 213) is formed at an interface between the body region 250 and the gate dielectric layer 209. Accordingly, the conductive channel 213 vertically extends in the depth direction of the semiconductor substrate. As a consequence, a current flow is accomplished between the source region 201 and the transistor contact portion 217 via the body region 250, the current flow being controlled by the gate electrode 210. A current flow is accomplished between the transistor contact portico 217 and the drain region 204 via the drift contact region 218 and the drift zone 240. Source contacts 202 may be arranged at the surface 110 of the semiconductor substrate to contact the source region 201 and to further contact the body region 250. Due to the electrical contact of the source contact 202 to the body region 250 a parasitic bipolar transistor may be avoided or suppressed. The semiconductor device may further comprise a buried semiconductor portion of the first or the second conductivity type disposed beneath the layer stack. The buried semiconductor portion may have a soft doping profile. According to the embodiment of FIG. 3A, the semiconductor device comprises a buried semiconductor portion 253 of the second conductivity type which is electrically connected to the connection region 222.

Figure 3B:
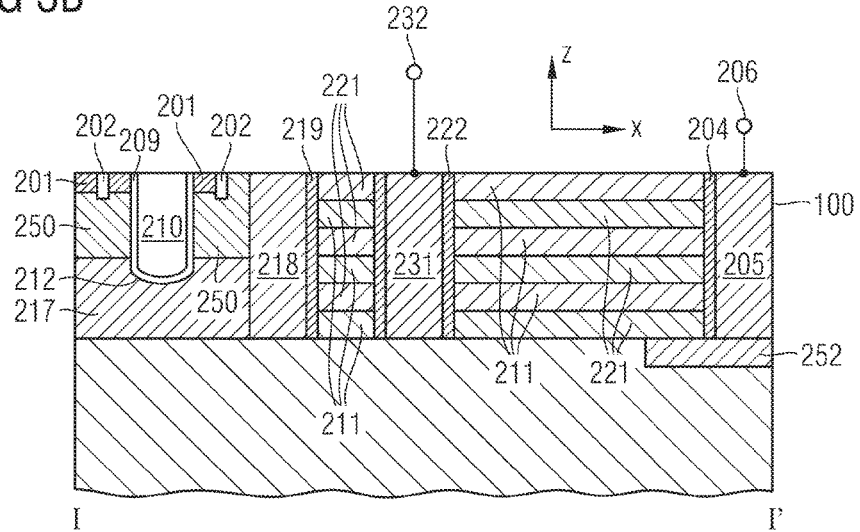
FIGS. 3B and 3C show cross-sectional views of further embodiments of the semiconductor device.

According to the embodiment of FIG. 3B, the semiconductor device may comprise a buried semiconductor portion 252 of the first conductivity type which is electrically connected to the drain region 204. The lowermost layer of the layer stack may be a compensation layer 221 of the second conductivity type. The further components of the embodiment of FIG. 3B are similar to the embodiment of FIG. 3A so that a detailed description thereof is omitted here. The cross-sectional view of FIG. 3B is taken between I and I', as is also indicated in FIG. 3A.

Figure 3C:
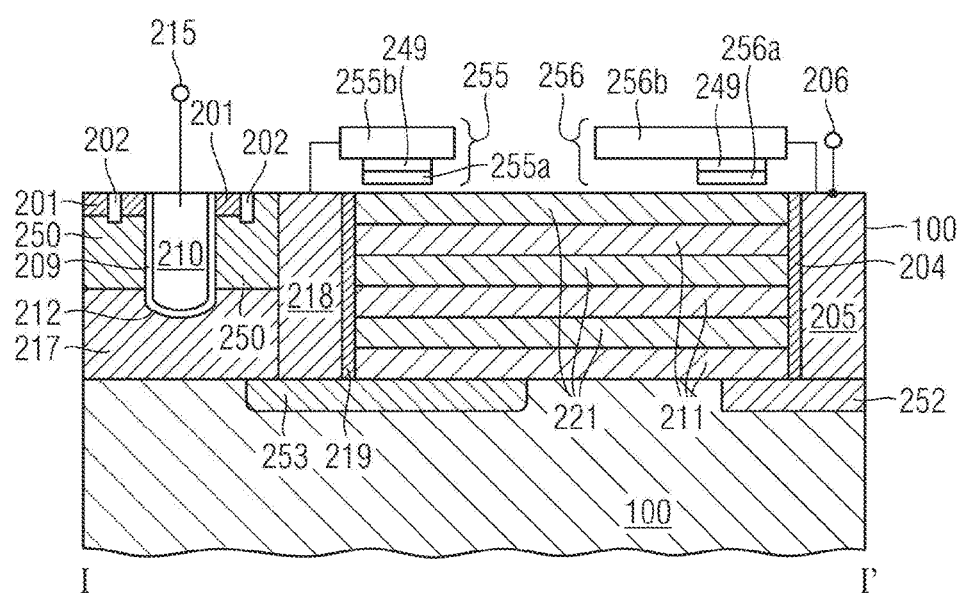

FIG. 3C shows a further embodiment according to which the semiconductor device comprises a buried semiconductor 252 portion of the first conductivity type which is electrically connected to the drain region 204. The semiconductor device further comprises a buried semiconductor portion 253 of the second conductivity type which is electrically connected to the connection region 222. According to embodiment, the buried semiconductor portion 252 may have a soft doping profile or an arbitrary doping profile. The buried semiconductor portion 253 of the second conductivity type may have a soft doping profile or an arbitrary doping profile. The semiconductor device may further comprise a first field plate 255 which may be disposed adjacent to the drift contact region 218 and which may be electrically connected to the drift contact region 218.

The semiconductor device may further comprise a second field plate 256 which may be electrically connected to the drain region 204. The second field plate 256 may be disposed adjacent to a drain region of the transistor. The first and second field plates 255, 256 may be implemented as conductive layers, e.g. doped polysilicon layers or metal layers. As is further indicated in FIG. 3C, the first and second field plates 255, 256 may be implemented to have a step-like shape. For example, they may comprise a base layer 255a, 256a and an upper layer 255b, 256b, which may be disposed over the base layer. The base layer and the upper layer may comprise different materials or may comprise the same materials. The upper layers 255b, 256b may have a larger area than respective the base layers 255a, 256a. For example, any of the upper layers 255b, 256b may be made of a metal. Further, any of the base layers 255a, 256a may be made of polysilicon. An insulating layer 249, e.g. a silicon oxide layer may be disposed between the base layer 255a, 256a and the upper layer 255b, 256b. The specific structure of the first or second field plate may be applied to any of the embodiments described herein.

Figure 4A:
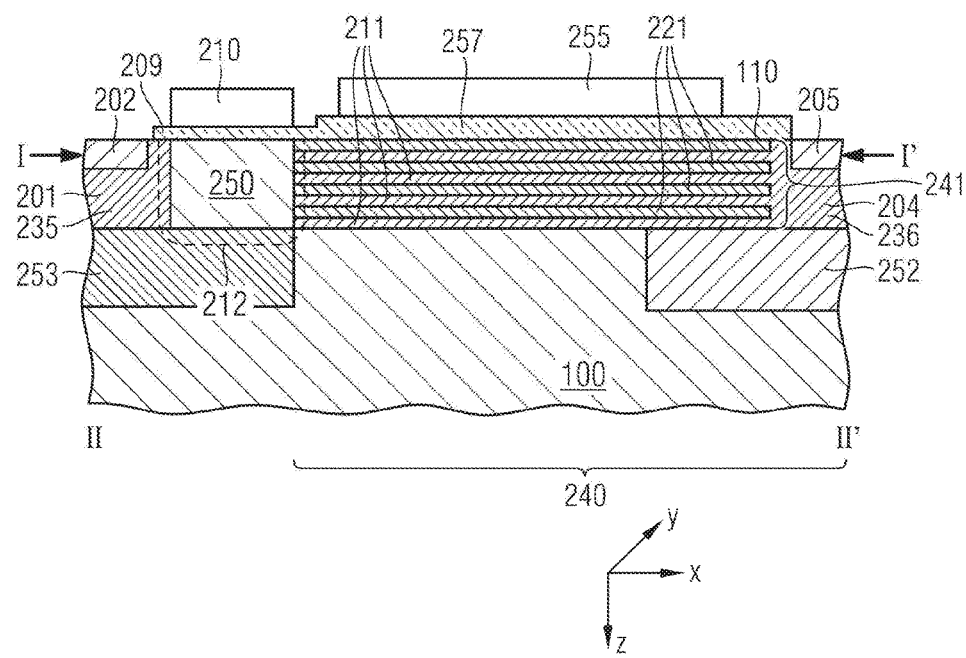
FIG. 4A shows a vertical cross-sectional view of a semiconductor device according to an embodiment.
Figure 4B:
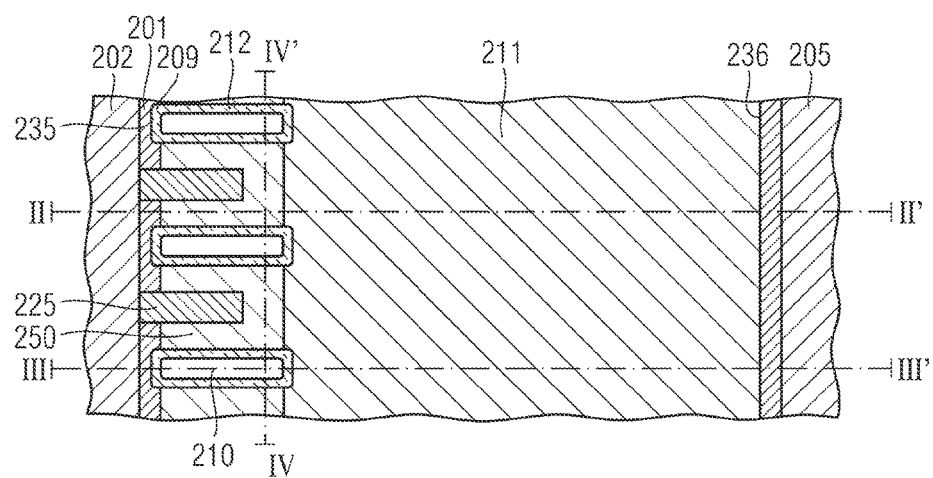
FIG. 4B shows a horizontal cross-sectional view of the semiconductor device shown in FIG. 4A.

FIG. 4A shows a vertical cross-sectional view of a semiconductor device according to a further embodiment. The cross-sectional view of FIG. 4A is taken between II and II', as is also indicated in FIG. 4B. Differing from embodiments described hereinabove, the body region 250 of the semiconductor device extends in the depth direction to approximately a lower side of the layer stack 241. The layer stack 241 comprises a drift layer 211 of the first conductivity type and a compensation layer 221 of the second conductivity type. The drain region 204 is electrically connected with the drift layer 211. Part of the body region 250 implements a connection region of the second conductivity type which extends into the depth direction of the semiconductor substrate. The part of the body region implementing the connection region is electrically connected with the compensation layer 221. As a result, the body region 250 may be electrically connected to the compensation layers 221 over the whole depth of the layer stack 241. The semiconductor device further comprises a buried semiconductor portion 252 of the first conductivity type beneath the layer stack and in electrical contact with the drain region 204.

As is further indicated in FIG. 4A, the gate electrode 210 is disposed in trenches 212. The trenches 212 (indicated by broken lines) are disposed before and behind the depicted plane of the drawing. A longitudinal axis of the gate trench 212 extends in the first direction, e.g. the x-direction. Due to this shape of the gate electrode 210, the gate electrode may vertically overlap with the layer stack 241. As a consequence, a portion of the body region the conductivity of which is controllable by the gate electrode vertically extends along the layer stack 241.

The source region 201 extends in the depth direction of the semiconductor substrate. The source region 201 may be electrically contacted to a source contact 202. As is clearly to be understood, the source contact 202 may be implemented in an alternative manner. A portion of the gate electrode 210 may be disposed above the first main surface 110 and may extend along the second direction, e.g. the y direction. The semiconductor device shown in FIG. 4A may be formed in a semiconductor substrate 100 of the second conductivity type. The drain region 204 may extend to a bottom region of the layer stack 241. The semiconductor device may comprise a buried semiconductor portion 253 of the second conductivity type. The buried semiconductor portion 253 of the second conductivity type may be disposed beneath the source region 201 and beneath the body region 250. In particular, the buried semiconductor portion 253 of the second conductivity type may overlap with the body region 250. The buried semiconductor portion 253 of the second conductivity type may have a soft doping profile.

Moreover, the semiconductor device may comprise a buried semiconductor portion 252 of the first conductivity type. For example, the buried semiconductor portion 252 of the first conductivity type may be disposed beneath the drain region 204 and may be electrically connected to the drain region 204. The buried semiconductor portion 252 of the first conductivity type may have a soft doping profile. The buried semiconductor portion 252 of the first conductivity type may horizontally overlap with the layer stack 241. As a result, peaks of the electrical field may be avoided at the junction of the buried semiconductor portion 252, 253 to the semiconductor substrate.

The semiconductor device may further comprise a field plate 255 which may e.g. be connected with the source terminal. A field dielectric layer 257 may be disposed between the field plate 255 and the layer stack 241.

FIG. 4B shows a horizontal cross-sectional view of the semiconductor device shown in FIG. 4A. As is indicated in FIG. 4B, the transistor comprises a source region 201 and a drain region 204 which are arranged at a first direction parallel to the first main surface 110. The semiconductor device further comprises a body region 250 adjacent to the source region 201, and a gate electrode 210 which is configured to control a conductivity of a conductive channel formed in the body region 250. The gate electrode 210 is arranged in a gate trench that extends in the depth direction of the semiconductor substrate. Likewise, the drain region 204 extends in a depth direction of the semiconductor substrate 100. The source region 201 may be arranged in a source groove 235 extending in the second direction. Further, the drain region 204 may be arranged in a drain groove 236 extending in the second direction.

The semiconductor device shown in FIG. 4B may further comprise a body contact portion 225 which may electrically connect the body region 250 with the source contact 202. The body contact region 225 may be a doped portion of the second conductivity type. The body contact portion 225 may extend in the depth direction of the substrate. The body contact portion 225 and the gate electrode 210 may be alternatingly disposed along the second direction. The body contact portion 225 may be electrically connected with the buried semiconductor portion 253 of the second conductivity type. Due to the presence of the body contact portion 225, a parasitic bipolar transistor may be avoided or suppressed.

Figure 4C:
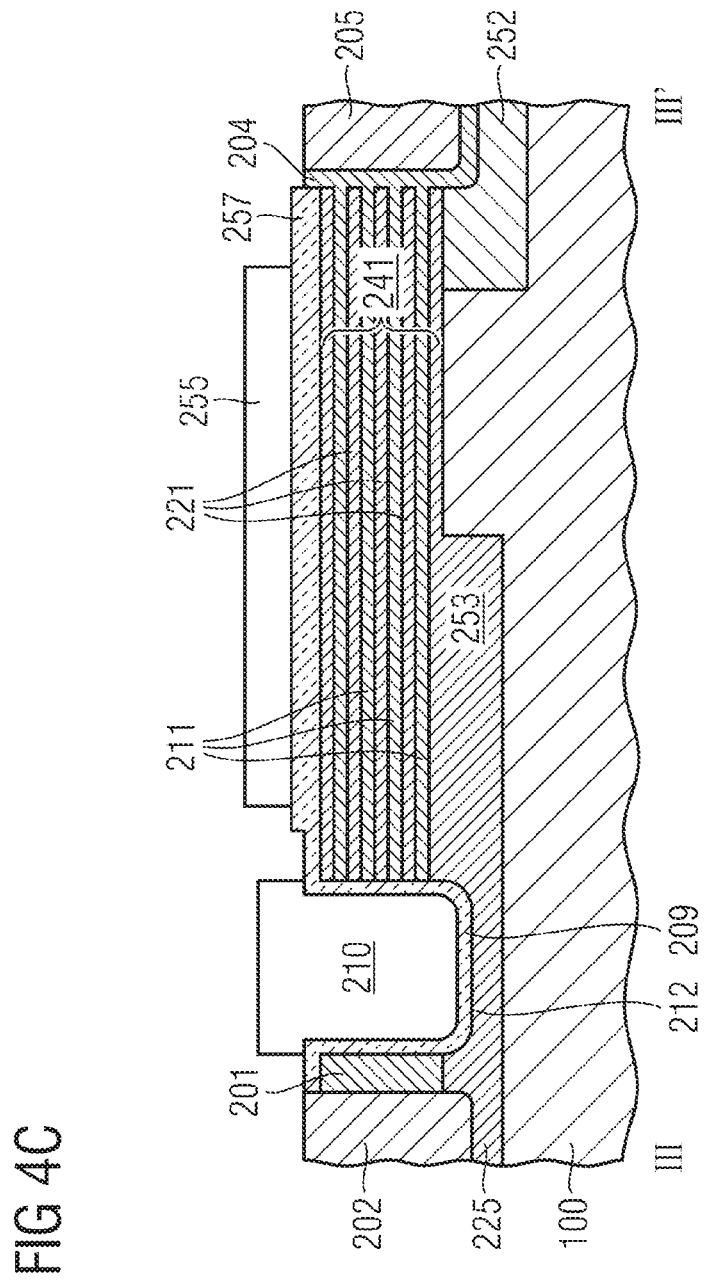
FIG. 4C shows a vertical cross-sectional view of the semiconductor device according to an embodiment.

FIG. 4C shows a cross-sectional view of an embodiment which may be taken between III and III' as is indicated in FIG. 4B. The cross-sectional view is taken so as to longitudinally intersect a gate trench 212. It is to be noted that there are some differences between the embodiment of FIG. 4C and that of FIG. 4B. For example, the source contact 202 may largely extend into the depth direction. Further, the buried semiconductor portion 253 of the second conductivity type has a soft doping profile and may extend to the source contact 202. In a plane before and behind the depicted plane of the drawing, the buried semiconductor portion 253 may contact a body contact portion 225. The body contact portion 225 may have a higher doping concentration than the buried semiconductor portion 253.

Figure 4D:
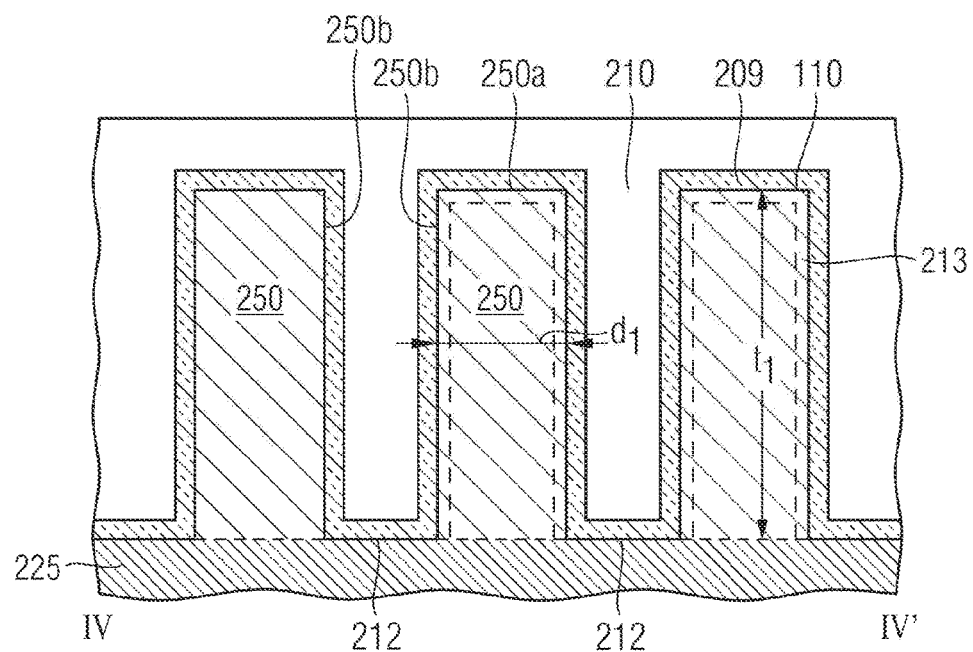
FIG. 4D shows a further cross-sectional view of a portion of the semiconductor device according to an embodiment.

FIG. 4D shows a cross-sectional view of components of the semiconductor device. The cross-sectional view of FIG. 4D is taken between IV and IV' so as to intersect a plurality of gate trenches 212. As is illustrated, the gate trenches 212 may pattern the body region 250 into the shape of ridges or fins. Each of the ridges may have a top side 250a and sidewalls 250b. As can be taken from FIG. 4B, a longitudinal axis of the ridges or the fins corresponds to the first direction.

The sidewalls 250b may extend perpendicularly or at an angle of more than 75° with respect to the first main surface 110. The gate electrode 210 may be disposed adjacent to at least two sides of the ridge.

When the transistor is switched on, e.g. by applying a suitable voltage to the gate electrode 210, a conductive inversion layer (conductive channel 213) may be formed at the boundary between the body region 250 and the gate dielectric layer 209. Accordingly, the field effect transistor is in a conducting state from the source region 201 to the drain region 204. In case of switching off, no conductive inversion layer is formed and the transistor is in a non-conducting state. According to an embodiment, the conductive channel regions 213 formed at opposing sidewalls 250b of a ridge do not merge with each other so that the body region 250 may not be fully depleted and may be connected to the source region and to the body contact region 225.

For example, a distance between adjacent gate trenches 212 that corresponds to a width d1 of the ridges may be larger than 200 nm, e.g. 200 to 2000 nm, for example, 400 to 600 nm. The transistor may further comprise a field plate. When the transistor is switched off, e.g. by applying a corresponding voltage to the gate electrode, carriers may be depleted from the drift zone. As a result, a doping concentration of the drift zone may be increased while maintaining the blocking capability of the transistor. As a result, the on-state resistance may be further reduced, while securing the high voltage blocking capability.

Figure 5A:
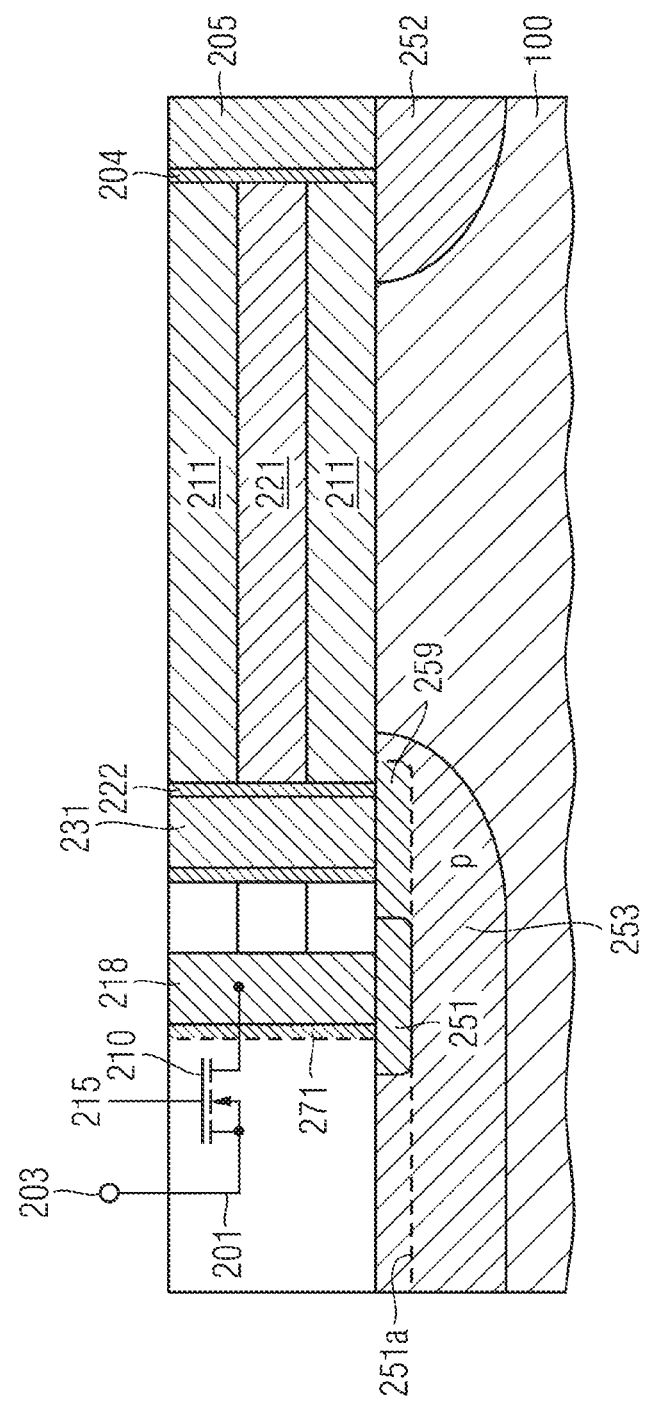
FIG. 5A shows a cross-sectional view of a portion of a semiconductor device according to an embodiment.

FIG. 5A shows a cross-sectional view of a semiconductor device according to a further embodiment. As is shown, in addition to the elements which have been described with reference to FIGS. 1A to 2C, the semiconductor device may comprise a buried semiconductor portion 252 of the first conductivity type which is electrically connected to the drain region 204. Moreover, the semiconductor device comprises a buried semiconductor portion 253 of the second conductivity type which is electrically connected to the connection contact 231. According to an embodiment, the buried semiconductor portion 253 may extend to a substrate portion beneath the source region 201. The buried semiconductor portion 253 may extend beyond a substrate portion beneath the source region. According to a further embodiment, the buried semiconductor portion 253 may have a soft doping profile. The semiconductor device further comprises a counter-doped portion 251 of the first conductivity type which may be embedded in the buried semiconductor portion 253 of the second conductivity type. As is indicated in FIG. 5A, the boundary 251a of the counter-doped portion 251 may extend as is indicated by broken lines. Optionally, the counter-doped portion 251 may comprise a weakly doped portion 259 which extends beneath the connection contact 231 and which is disposed between the buried semiconductor portion 253 of the second conductivity type and the connection contact 231. The weakly doped portion 259 may be doped at the comparatively low doping concentration. According to a further embodiment, the portion 259 may have the same doping type and concentration as the buried semiconductor portion 253. Moreover, the substrate 100 may be of the second conductivity type and may be doped at a low doping concentration. For example, the doping concentration of the substrate may be less than 1e14 $cm^{-3}$. Due to this structure, the substrate may be held at a potential which may be close to the source potential. Further it may be set to a higher voltage than the source potential. As a result, a higher range of source voltages may be applied. Hence, the semiconductor device may be mounted to the same leadframe as a control-integrated circuit without the fear of detrimental effects.

Figure 5B:
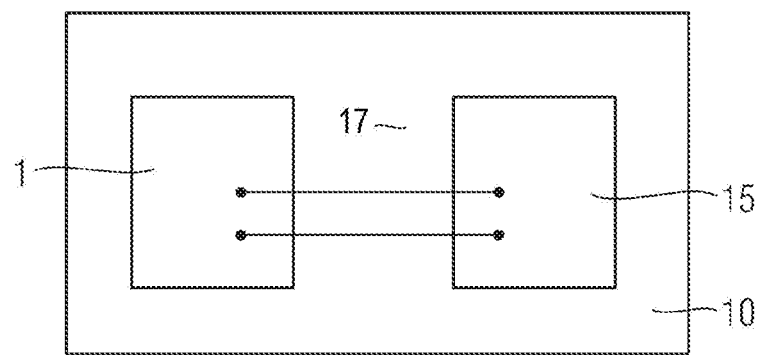
FIG. 5B shows a plan view of an electric device according to an embodiment.

FIG. 5B shows an example of an electrical device 10 according to an embodiment. The electrical device 10 comprises the semiconductor device 1 illustrated in FIG. 5A and a control circuit 15 for controlling the functionality of the semiconductor device. The control circuit 15 may be an integrated circuit. For example, the control circuit 15 may comprise a driving circuit, converting circuits, sensor circuit and others so as to provide the desired functionality of the semiconductor device. The semiconductor device 1 and the control circuit 15 may be mounted on the same lead frame 17. Examples of the electrical device comprise flyback converters, LED drivers, power factor control (PFC) stages and controllers.

Figure 6A:
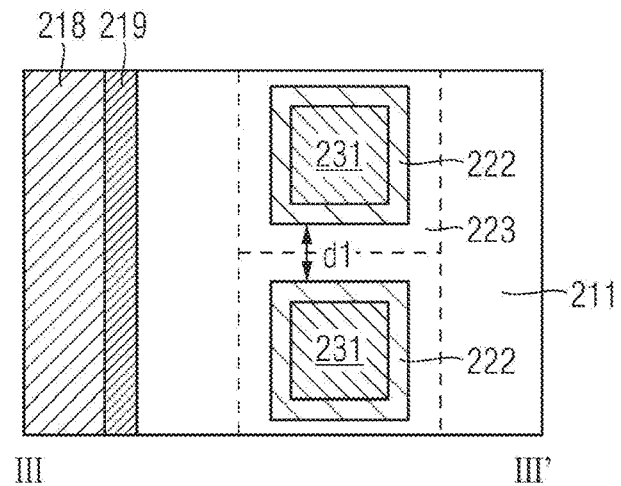
FIG. 6A shows a horizontal cross-sectional view further of a semiconductor device according to an embodiment.

FIG. 6A shows a horizontal cross-sectional view of a portion of the semiconductor device according to a further embodiment. The cross-sectional view of FIG. 6A is taken between III and III', as is also indicated in FIG. 1A. When an appropriate potential difference is present between the connection contact 231 and the drift layer 211, a corresponding depletion zone 223 forms between the oppositely doped semiconductor portions. A distance d1 between the connection regions 222 of adjacent connection contacts 231 may be such that the depletion zones 223 contact each other resulting in a pinch-off of the depletion layer. As a result, the blocking characteristics of the semiconductor device 1 may be further improved.

Figure 6B:
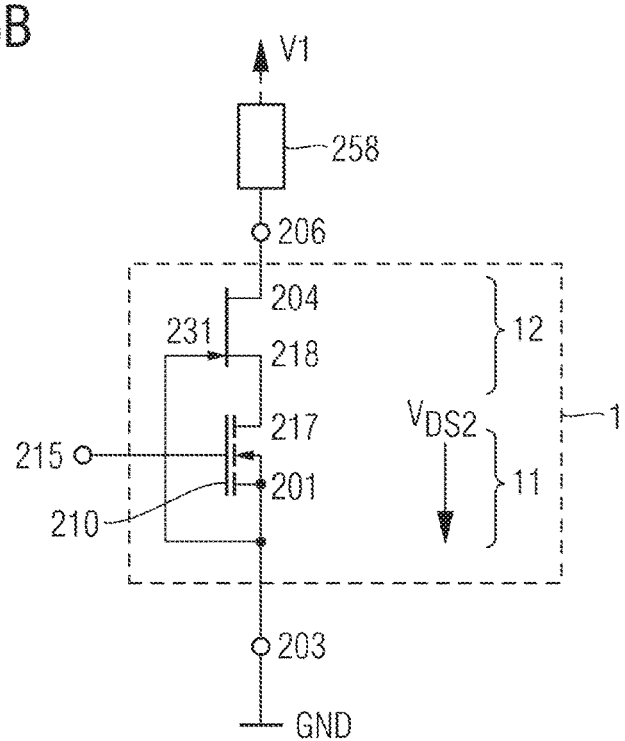
FIG. 6B shows an equivalent circuit diagram of a semiconductor device.

FIG. 6B shows an equivalent circuit diagram of the semiconductor device which has been described with reference to FIGS. 1A to 1C, 2A to 2C, 3A to 3C and 6A. The semiconductor device 1 may be interpreted to comprise a first transistor 11 and a second transistor 12 which are connected in series. The source region 201 of the first transistor 11 constitutes the source region of the complete device 1. The drain region 204 of the second transistor 12 constitutes the drain region of the overall device 1. The first transistor 11 further comprises a first drain region 217. The gate electrode 210 of the first transistor 11 controls the conductivity of a channel formed between the source region 201 and the first drain region 217. The gate electrode 210 may be electrically connected to a gate terminal 215. The first transistor 11 may be implemented by a MOSFET. The second transistor 12 may be implemented by a JFET. The second transistor 12 comprises a second source region 218. The connection contact 231 of the second transistor 12 may implement the gate electrode of the corresponding JFET. The gate electrode or connection contact 231 of the second transistor 12 is electrically connected with the source region 201 of the first transistor 11. The source region 201 may be held at ground. Moreover, the drain region 206 may be connected to a load 258. When the transistor is switched off, the drift layers 211 may be depleted by the adjacent compensation layer 221 so that a current flow is prevented or deteriorated. Optionally, further due to the distance d1 of the connection contacts 231, a pinch-off may be caused in the drift layers 211 which further increases the blocking capability of the semiconductor device 1.

FIG. 7A shows a cross-sectional views of a semiconductor device according to a further embodiment. The cross-sectional view of FIG. 7A is taken between I and I', as is also indicated in FIG. 7B. The semiconductor device comprises a transistor comprising a source region 201, a drain region 204, a body region 250 and a gate electrode 210. The source region 201, the body region 250 and the drain region 204 are arranged along the first direction e.g. the x direction parallel to the first main surface 110 of the semiconductor substrate 100. The gate electrode 210 is disposed in a gate trench 212 that is formed in the first main surface 110. The gate electrode 210 is disposed adjacent to the body region 250. A field plate 255 may be disposed in the gate trench 212 or in a field plate trench separated from the gate trench 212. A gate dielectric layer 209 may be disposed between the body region 250 and the gate electrode 210. A field dielectric layer 257 may be disposed between the field plate 255 and the drift zone 240. A buried semiconductor portion 253 of the second conductivity type may be arranged below the body region 250. The buried semiconductor portion 253 of the second conductivity type may have a soft doping profile as has been explained above. The buried semiconductor portion 253 of the second conductivity type may be electrically connected to the source contact 202. The buried semiconductor portion 253 of the second conductivity type may horizontally overlap with the body region 250. Accordingly, there may be a lateral region in which the buried semiconductor portion 253 and the body region 250 are present.

FIG. 7B shows a horizontal cross-sectional view of the semiconductor device 1. As is illustrated, the gate electrode 210 and the field plate 255 may be arranged in a gate trench 212. The field dielectric layer 257 may have a larger thickness than the gate dielectric layer 209. The field dielectric layer 257 may not overlap with the body region 250.

While embodiments of the invention have been described above, it is obvious that further embodiments may be implemented. For example, further embodiments may comprise any subcombination of features recited in the claims or any subcombination of elements described in the examples given above.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc, and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a drift contact region;
    a drain region of a first conductivity type, the drift contact region and the drain region being arranged in a first direction parallel to a first main surface of a semiconductor substrate;
    a layer stack comprising a drift layer of the first conductivity type and a compensation layer of a second conductivity type, the drain region being electrically connected with the drift layer;
    a body region of the second conductivity type;
    a connection region of the second conductivity type extending from the first main surface of the semiconductor substrate and into the layer stack, the connection region being electrically connected with the compensation layer; and
    a buried semiconductor portion beneath the layer stack and in electrical contact with the connection region,
    wherein the buried semiconductor portion does not fully overlap with the drift layer,
    wherein in the first direction, the layer stack is interposed between the drain region and the drift contact region and the drift contact region is interposed between the layer stack and the body region.

2. The semiconductor device of claim 1, wherein the layer stack is a horizontal layer stack and the drift layer is a lowermost layer of the layer stack.

3. The semiconductor device of claim 1, further comprising a source region and a gate electrode adjacent to the body region.

4. The semiconductor device of claim 3, wherein the gate electrode is configured to control a conductivity of a channel formed in the body region, the channel being electrically connected to the drift layer via a transistor contact portion and the drift contact region.

5. The semiconductor device of claim 3, wherein the gate electrode is disposed in a gate trench in the first main surface of the semiconductor substrate, the gate electrode being configured to control a conductivity of a channel formed in the body region, the channel being electrically connected to the drift layer.

6. The semiconductor device of claim 5, wherein the gate trench laterally extends from the source region to the layer stack.

7. The semiconductor device of claim 1, further comprising an additional buried semiconductor portion of the first conductivity type beneath the layer stack in electrical contact with the drain region.

8. The semiconductor device of claim 1, further comprising a field plate over the layer stack, the field plate being arranged on a side remote from the drain region.

9. The semiconductor device of claim 1, further comprising a field plate over the layer stack, the field plate being arranged on a side of the drain region.

10. The semiconductor device of claim 1, further comprising a counter-doped portion of the first doping type embedded in the buried semiconductor portion and directly adjacent to the drift contact region.

11. The semiconductor device of claim 1, wherein the buried semiconductor portion is disposed below and in direct contact with the connection region.

12. The semiconductor device of claim 1, wherein the layer stack comprises three drift layers and three compensation layers.

13. The semiconductor device of claim 1, wherein the buried semiconductor portion has a soft doping profile.

14. An electrical device comprising the semiconductor device of claim 1 and a control circuit.

15. The electrical device of claim 14, wherein the semiconductor device and the control circuit are mounted on a single lead frame.

16. The electrical device of claim 14, wherein the electrical device is selected from the group of a flyback converter, an LED driver, a power factor control device and a controller.

17. The semiconductor device of claim 1, wherein the body region is in direct contact with the drift contact region.

18. The semiconductor device of claim 1, wherein the buried semiconductor portion does not overlap at all with the drain region.

19. The semiconductor device of claim 1, wherein the drift contact region is arranged in a contact groove formed in the semiconductor substrate.

20. The semiconductor device of claim 19, wherein the contact groove has a doped sidewall facing the layer stack, and wherein the drift layer is electrically connected to the drift contact region via the doped sidewall of the contact groove.

21. A semiconductor device, comprising:
a drift contact region;
a drain region of a first conductivity type, the drift contact region and the drain region being arranged in a first direction parallel to a first main surface of a semiconductor substrate;
a layer stack comprising a drift layer of the first conductivity type and a compensation layer of a second conductivity type, the drain region being electrically connected to the drift layer;
a connection region of the second conductivity type extending into the semiconductor substrate, the connection region being electrically connected with the compensation layer; and
a buried semiconductor portion of the first conductivity type beneath the layer stack and in electrical contact with the drain region, the buried semiconductor portion having a soft doping profile.

22. The semiconductor device of claim 21, further comprising a source region, body region and a gate electrode adjacent to the body region.

23. The semiconductor device of claim 22, wherein the gate electrode is configured to control a conductivity of a channel formed in the body region, the channel being electrically connected to the drift layer via a transistor contact portion and the drift contact region.

24. The semiconductor device of claim 22, wherein the gate electrode is disposed in a gate trench in the first main surface of the semiconductor substrate, the gate electrode being configured to control a conductivity of a channel formed in the body region, the channel being electrically connected to the drift layer.

25. The semiconductor device of claim 21, further comprising a field plate over the layer stack, the field plate being arranged on a side remote from the drain region.

26. The semiconductor device of claim 21, further comprising a field plate over the layer stack, the field plate being arranged on a side of the drain region.

27. A semiconductor device, comprising:
a source region in a semiconductor substrate;
a drain region in the semiconductor substrate;
a body region adjacent to the source region in the semiconductor substrate;
a gate electrode configured to control a conductivity of a channel formed in the body region, the gate electrode being arranged in a gate trench extending in the semiconductor substrate;
a drift zone, wherein the source region, the drain region, the body region and the drift zone are arranged in a first direction parallel to a first main surface of the semiconductor substrate; and
a buried semiconductor portion of a second conductivity type beneath the body region, the buried semiconductor portion having a soft doping profile.

28. A semiconductor device, comprising:
a drift contact region;
a drain region of a first conductivity type, the drift contact region and the drain region being arranged in a first direction parallel to a first main surface of a semiconductor substrate;
a layer stack comprising a drift layer of the first conductivity type and a compensation layer of a second conductivity type, the drain region being electrically connected with the drift layer;
a connection region of the second conductivity type extending from the first main surface of the semiconductor substrate and into the layer stack, the connection region being electrically connected with the compensation layer; and
a buried semiconductor portion beneath the layer stack and in electrical contact with the connection region,
wherein the buried semiconductor portion does not fully overlap with the drift layer,
wherein the drift contact region is arranged in a contact groove formed in the semiconductor substrate.

29. The semiconductor device of claim 28, wherein the contact groove has a doped sidewall facing the layer stack, and wherein the drift layer is electrically connected to the drift contact region via the doped sidewall of the contact groove.

* * * * *